(12) United States Patent
Kikuchi

(10) Patent No.: US 10,765,022 B2
(45) Date of Patent: Sep. 1, 2020

(54) CASING

(71) Applicant: MITSUBISHI ELECTRIC CORPORATION, Chiyoda-ku, Tokyo (JP)

(72) Inventor: Kazuto Kikuchi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 16/075,720

(22) PCT Filed: Feb. 15, 2016

(86) PCT No.: PCT/JP2016/054302
§ 371 (c)(1),
(2) Date: Aug. 6, 2018

(87) PCT Pub. No.: WO2017/141319
PCT Pub. Date: Aug. 24, 2017

(65) Prior Publication Data
US 2019/0037719 A1 Jan. 31, 2019

(51) Int. Cl.
*H05K 5/02* (2006.01)
*H05K 5/03* (2006.01)
(Continued)

(52) U.S. Cl.
CPC ........... *H05K 5/0221* (2013.01); *G06F 1/181* (2013.01); *H05K 5/0013* (2013.01); *H05K 5/03* (2013.01); *E05B 65/006* (2013.01)

(58) Field of Classification Search
CPC ...... H05K 5/0221; H05K 5/0013; H05K 5/03; G06F 1/181
See application file for complete search history.

(56) References Cited

U.S. PATENT DOCUMENTS 4,653,783 A * 3/1987 Steup .................... G11B 33/02
292/19
5,285,229 A * 2/1994 Kamata .................. G03B 19/04
220/284
(Continued)

FOREIGN PATENT DOCUMENTS

CN 101513145 A 8/2009
EP 0619634 A1 10/1994
(Continued)

OTHER PUBLICATIONS

International Search Report (PCT/ISA/210) dated May 10, 2016, by the Japanese Patent Office as the International Searching Authority for International Application No. PCT/JP2016/054302.
(Continued)

*Primary Examiner* — Nidhi Thaker
(74) *Attorney, Agent, or Firm* — Buchanan Ingersoll & Rooney PC

(57) ABSTRACT

A case includes a hook caught on part of a cover. The cover includes an insertion portion of a cylindrical shape into which a rod to detach the caught hook is inserted. The insertion portion includes an inclined portion and a receiving portion on which the hook is caught. When the rod is inserted into the insertion portion, the tip end of the rod is put into a gap between the inclined portion and the hook, and the rod is inclined toward the inclined portion, then the hook is detached from the receiving portion.

5 Claims, 13 Drawing Sheets

(51) Int. Cl.
*G06F 1/18* (2006.01)
*H05K 5/00* (2006.01)
*E05B 65/00* (2006.01)

(56) References Cited

U.S. PATENT DOCUMENTS

| | | | | |
|---|---|---|---|---|
| 5,634,675 | A * | 6/1997 | Mo | E05C 19/06 |
| | | | | 220/284 |
| 6,094,785 | A * | 8/2000 | Montgomery | B25B 31/00 |
| | | | | 24/108 |
| 6,430,976 | B1 * | 8/2002 | Mitsuyama | E05B 73/0023 |
| | | | | 206/1.5 |
| 7,427,085 | B2 * | 9/2008 | Sio | E05C 19/066 |
| | | | | 292/19 |
| 7,429,700 | B2 * | 9/2008 | Kanamaru | H01R 13/506 |
| | | | | 174/135 |
| 7,944,690 | B2 * | 5/2011 | Yamagiwa | H05K 5/0013 |
| | | | | 29/426.1 |
| 9,549,474 | B2 * | 1/2017 | Hu | H05K 5/0013 |
| 10,111,350 | B2 * | 10/2018 | Morihara | H05K 7/1427 |
| 2009/0273906 | A1 | 11/2009 | Bohnen et al. | |

FOREIGN PATENT DOCUMENTS

| | | |
|---|---|---|
| JP | S59-90372 A | 5/1984 |
| JP | S61-30280 U | 2/1986 |
| JP | S63-29840 U | 2/1988 |
| JP | S63-35245 U | 3/1988 |
| JP | 2009-266480 A | 11/2009 |
| JP | 2011-109846 A | 6/2011 |

OTHER PUBLICATIONS

Written Opinion (PCT/ISA/237) dated May 10, 2016, by the Japanese Patent Office as the International Searching Authority for International Application No. PCT/JP2016/054302.

Office Action dated Nov. 5, 2019, by the Chinese Patent Office in corresponding Chinese Patent Application No. 201680081431.2 and English translation of the Office Action. (17 pages).

Office Action dated Mar. 6, 2020, by the India Patent Office in corresponding India Patent Application No. 201847029121 and English translation of the Office Action. (5 pages).

* cited by examiner

CASING

TECHNICAL FIELD

The present invention relates to a casing in which an electronic apparatus or the like is accommodated.

BACKGROUND ART

It is often necessary to use a protection cover around a terminal block of an electronic apparatus to satisfy various standards and safety.

The cover should not be easy to attach/detach and is necessary to attach/detach by a user using some sort of tool on purpose.

When the cover is fixed to a case using components such as screws and nuts, a cost increases because of the need of those components.

To hold down the cost, there is also present a technique for fixing the cover using a flexible hook as an alternative to the components such as the screws and the nuts.

Patent Literature 1 to Patent Literature 3 each disclose a structure for detaching a cover by deforming a flexible hook using a tool such as a flat-blade screwdriver.

However, with these structures, a range of operating the tool is difficult to understand; thus, the cover is unlikely to be easy to detach.

Furthermore, because of the absence of a structure for restricting a range in which the hook is deformed, the hook is likely to be excessively deformed and broken.

CITATION LIST

Patent Literature

Patent Literature 1:
Japanese Unexamined Utility Model Application Publication No. 63-29840
Patent Literature 2:
Japanese Unexamined Patent Application Publication No. 2009-266480
Patent Literature 3:
Japanese Unexamined Patent Application Publication No. 59-90372

SUMMARY OF INVENTION

Technical Problem

An object of the invention is to prevent breakage of a hook that fixes a cover to a case when the hook is detached.

Solution to Problem

A casing according to the present invention includes:
a case in which an object is accommodated; and
a cover attached to the case,
wherein the case includes
a hook caught on part of the cover,
the cover includes
an insertion portion of a cylindrical shape into which a rod to detach the caught hook is inserted, and
the insertion portion includes
an inclined portion that is formed to be inclined and that constitutes part of the cylindrical shape; and
a receiving portion that is a portion protruding toward an interior of the cylindrical shape from the inclined portion and that is a portion on which the hook is caught.

Advantageous Effects of Invention

According to the invention, since an inclined portion restricts a range of operating a rod for detaching a hook, a range in which the hook is deformed by the rod is restricted. It is thereby possible to prevent breakage of the hook.

BRIEF DESCRIPTION OF DRAWINGS

FIG. 1 is a configuration diagram of a casing 100 according to an embodiment 1.
FIG. 2 is a side cross-sectional view of a fixed portion 109 according to the embodiment 1.
FIG. 3 illustrates a motion of the fixed portion 109 according to the embodiment 1.
FIG. 4 illustrates the motion of the fixed portion 109 according to the embodiment 1.
FIG. 5 is a side cross-sectional view of the fixed portion 109 according to an embodiment 2.
FIG. 6 illustrates a motion of the fixed portion 109 according to the embodiment 2.
FIG. 7 illustrates the motion of the fixed portion 109 according to the embodiment 2.
FIG. 8 is a side cross-sectional view of the fixed portion 109 according to an embodiment 3.
FIG. 9 illustrates a motion of the fixed portion 109 according to the embodiment 3.
FIG. 10 illustrates the motion of the fixed portion 109 according to the embodiment 3.
FIG. 11 is a side cross-sectional view of the fixed portion 109 according to an embodiment 4.
FIG. 12 illustrates a motion of the fixed portion 109 according to the embodiment 4.
FIG. 13 illustrates the motion of the fixed portion 109 according to the embodiment 4.

DESCRIPTION OF EMBODIMENTS

Embodiment 1

A casing 100 in which an electronic apparatus or the like is accommodated will be described with reference to FIGS. 1 to 4.

Description of Configuration

A configuration of the casing 100 will be described with reference to FIGS. 1 and 2.

Figure 1:
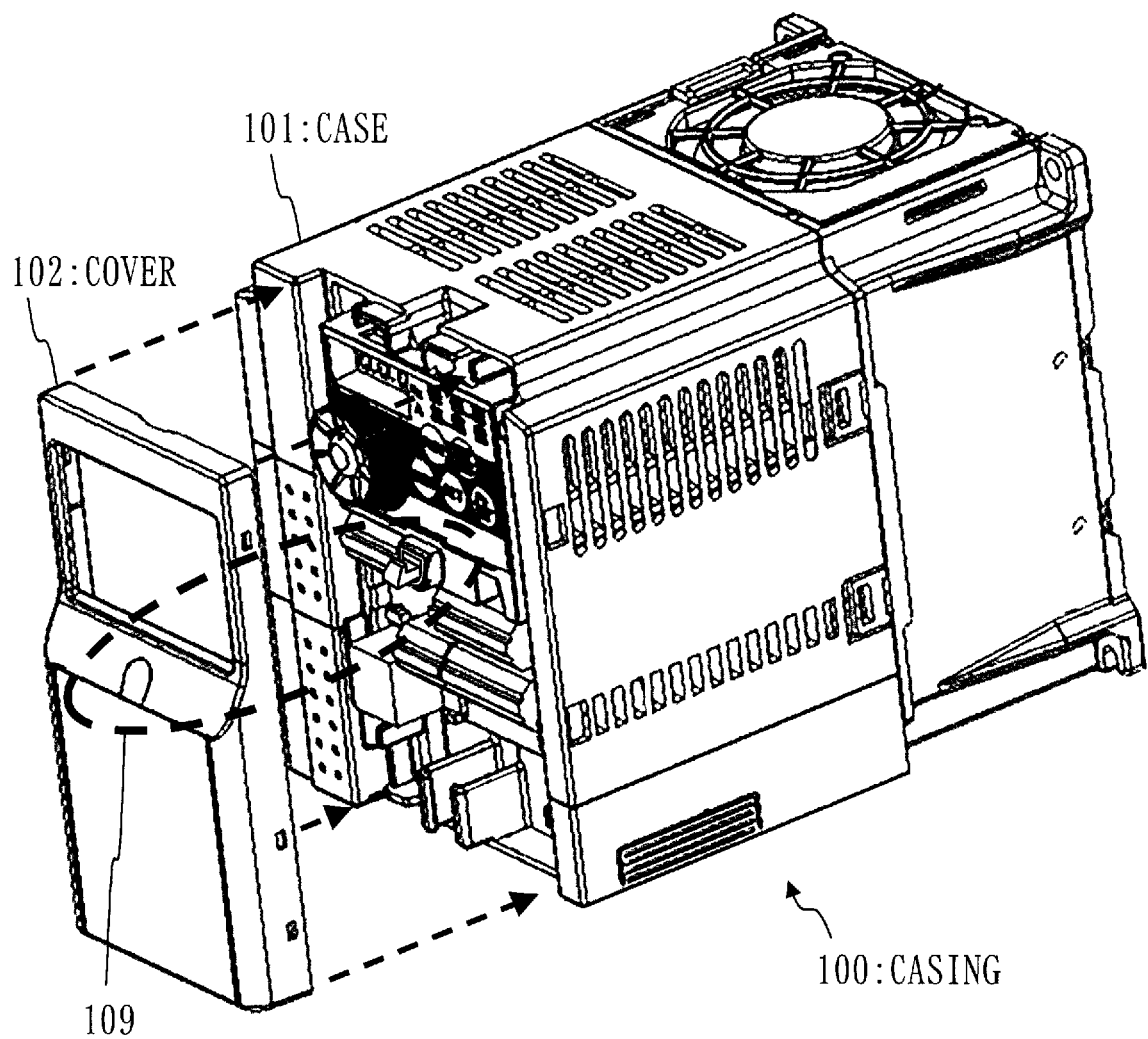
[FIG. 1]

In FIG. 1, the casing 100 includes a case 101 in which an object is accommodated and a cover 102 attached to the case 101. Specifically, the case 101 is a case in which an electronic apparatus is accommodated and the cover 102 is a cover that protects terminals of the electronic apparatus.

When the cover 102 is attached to a front side of the case 101, the cover 102 is fixed to the case 101 in a portion surrounded by a broken-line ellipse.

The portion surrounded by the broken-line ellipse will be referred to as "fixed portion 109", and a structure of the fixed portion 109 will be described hereinafter.

Figure 2:
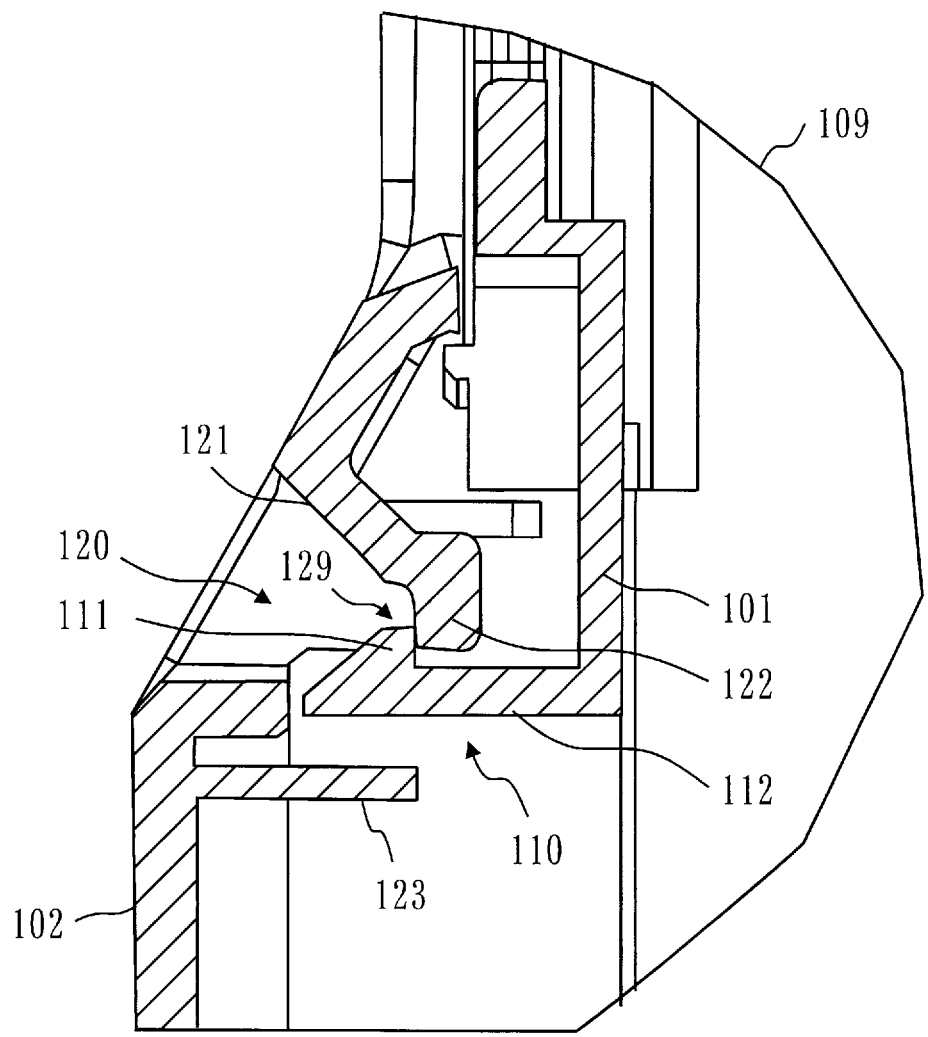
[FIG. 2]

FIG. 2 illustrates a side cross-sectional view of the fixed portion 109 when the case 101 is attached to the cover 102.

The case 101 has a hook 110 caught on part of the cover 102. The hook 110 exhibits flexibility. That is, the hook 110 can be bent.

The cover 102 has an insertion portion 120 into which a rod for detaching the caught hook 110 is inserted. The rod is specifically a tool such as a flat-blade screwdriver.

The insertion portion 120 is configured with an inclined portion 121 and a receiving portion 122.

The inclined portion 121 is a portion formed to be inclined.

The receiving portion 122 is a portion which protrudes from the inclined portion 121 toward a cylindrical interior and on which the hook 110 is caught.

The hook 110 has a claw portion 111 and a body portion 112. The hook 110 is hook-shaped.

The claw portion 111 is a portion caught on the receiving portion 122.

The body portion 112 is a portion continuous with the claw portion 111. Specifically, the claw portion 111 is provided in a portion of a tip end of the body portion 112.

The receiving portion 122 has a length to such an extent that a gap 129 into which a tip end of the rod is put is generated between a portion of a base continuous with the inclined portion 121 and the claw portion 111 of the hook 110 when the claw portion 111 of the hook 110 is caught on the receiving portion 122.

Furthermore, the cover 102 has a restraint rib 123 that protrudes in a direction in which the case 101 is provided. The restraint rib 123 is plate-shaped.

The restraint rib 123 is provided in a portion on which a tip end of the hook 110 strikes when the body portion 112 of the hook 110 is inclined to such an extent that the claw portion 111 of the hook 110 is detached from the receiving portion 122. Specifically, the restraint rib 123 is provided in a portion on which the claw portion 111 strikes. The claw portion 111 is located on the tip end of the body portion 112.

Description of Motion

A motion of the fixed portion 109 when the case 101 is detached from the cover 102 will be described with reference to FIGS. 3 and 4.

Figure 3:
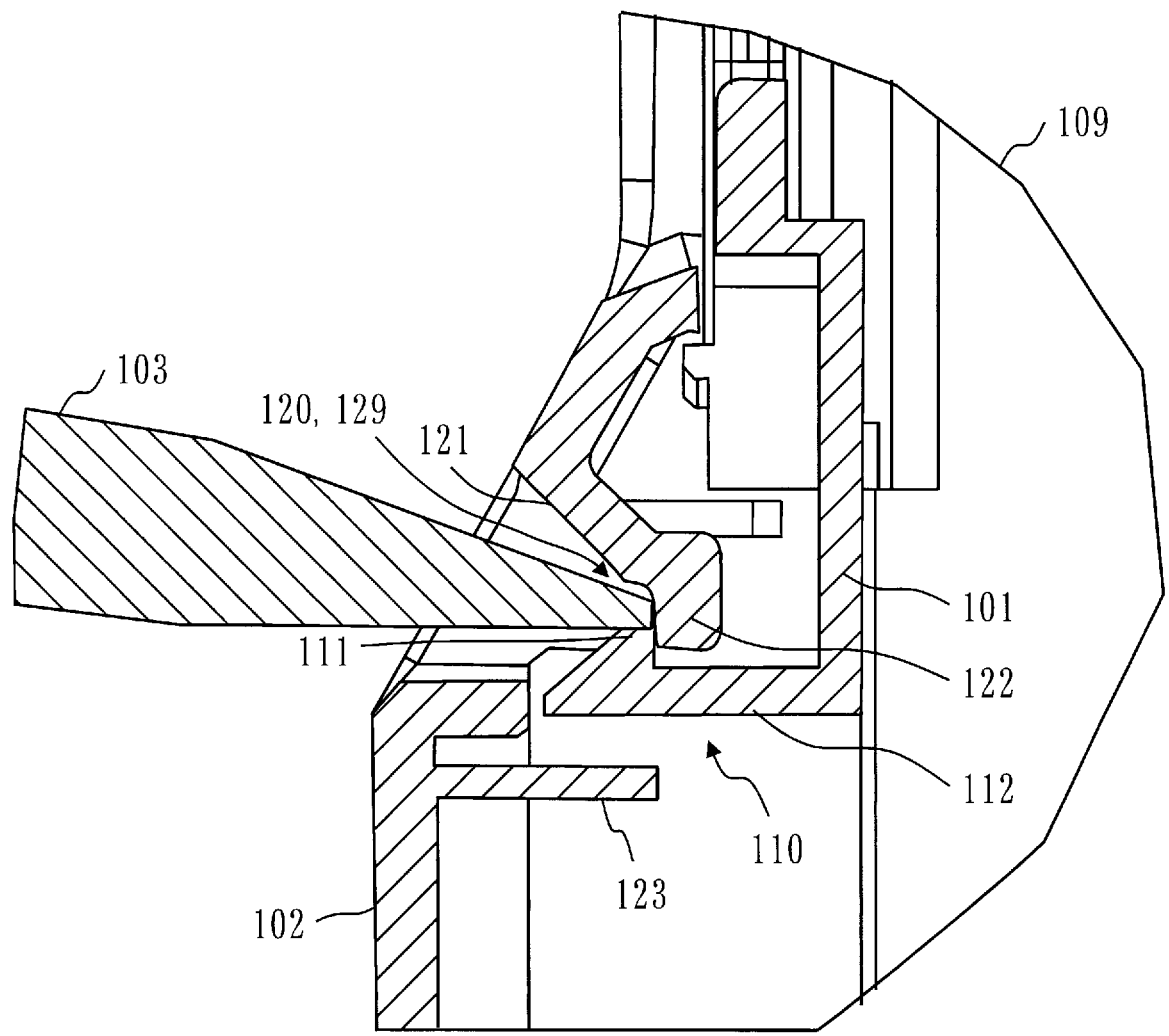
[FIG. 3]

In FIG. 3, a rod 103 is inserted into the insertion portion 120 and a tip end of the rod 103 is put into the gap 129. When the rod 103 is inclined toward the inclined portion 121, the fixed portion 109 turns into a state of FIG. 4.

Figure 4:
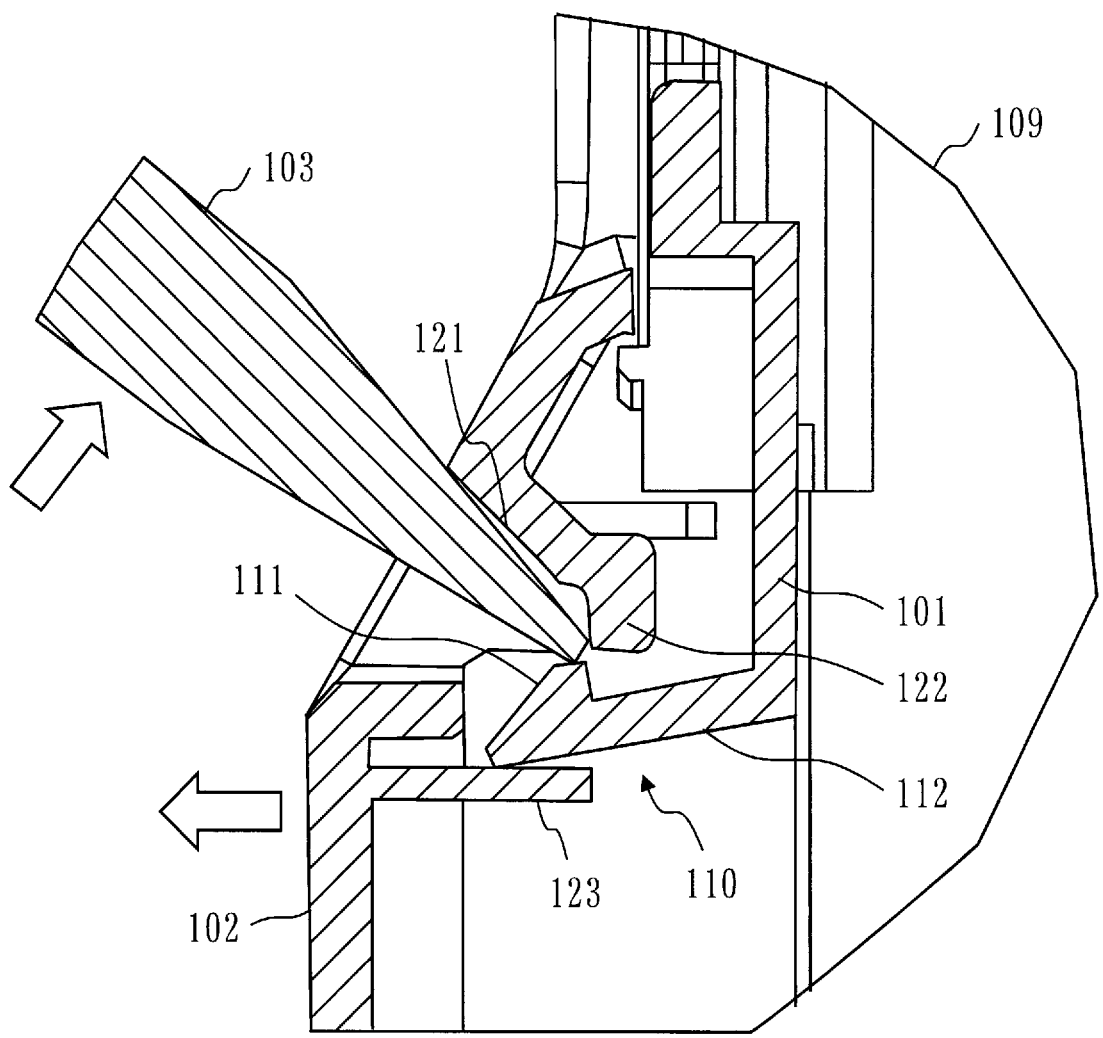
[FIG. 4]

In FIG. 4, when the rod 103 is inclined toward the inclined portion 121, the tip end of the rod 103 presses down the claw portion 111.

At this time, the body portion 112 of the hook 110 is bent, the body portion 112 thereof is inclined, and the claw portion 111 thereof is detached from the receiving portion 122.

When the case 101 is separated from the cover 102 in this state, the case 101 can be detached from the cover 102.

Furthermore, when the body portion 112 is inclined to such an extent that the claw portion 111 is detached from the receiving portion 122, the claw portion 111 strikes on the restraint rib 123. Specifically, when the rod 103 is inclined to such an extent that the rod 103 strikes on an inlet-side end portion of the inclined portion 121 and the body portion 112 is inclined, the claw portion 111 strikes on the restraint rib 123.

Owing to this, a range in which the body portion 112 is bent is restricted. Specifically, an angle at which the hook 110 is bent at a base of the body portion 112 is restricted.

It is thereby possible to prevent breakage of the hook 110. Specifically, it is possible to prevent the hook 110 from being broken at the base of the body portion 112.

Advantageous Effects of Embodiment 1

Providing the inclined portion 121 as a guide at a time of performing attachment/detachment operation using the rod 103 enables an operation range of the rod 103 to be made clear.

Providing the restraint rib 123 that restricts a movement of the flexible hook 110 enables prevention of the breakage of the hook 110.

While the restraint rib 123 is provided to prevent the breakage of the hook 110 by work using the rod 103 as the tool, the restraint rib 123 also exhibits a restraint force when some other sort of external force is applied.

Other Configuration

The inclined portion 121 restricts a range in which the rod 103 is inclined. As a result, a range in which a base of the hook 110 is bent is also restricted. Owing to this, it is not always necessary to provide the restraint rib 123 on the cover 102 for the purpose of preventing the breakage of the hook 110. That is, it is not always necessary to provide the restraint rib 123 in the portion on which part of the hook 110 strikes.

Embodiment 2

A mode in which a structure that facilitates detaching the cover 102 is provided in the hook 110 will be described with reference to FIGS. 5 to 7. It is noted, however, that description overlapping with that of the embodiment 1 will be omitted or simplified.

Description of Configuration

Figure 5:
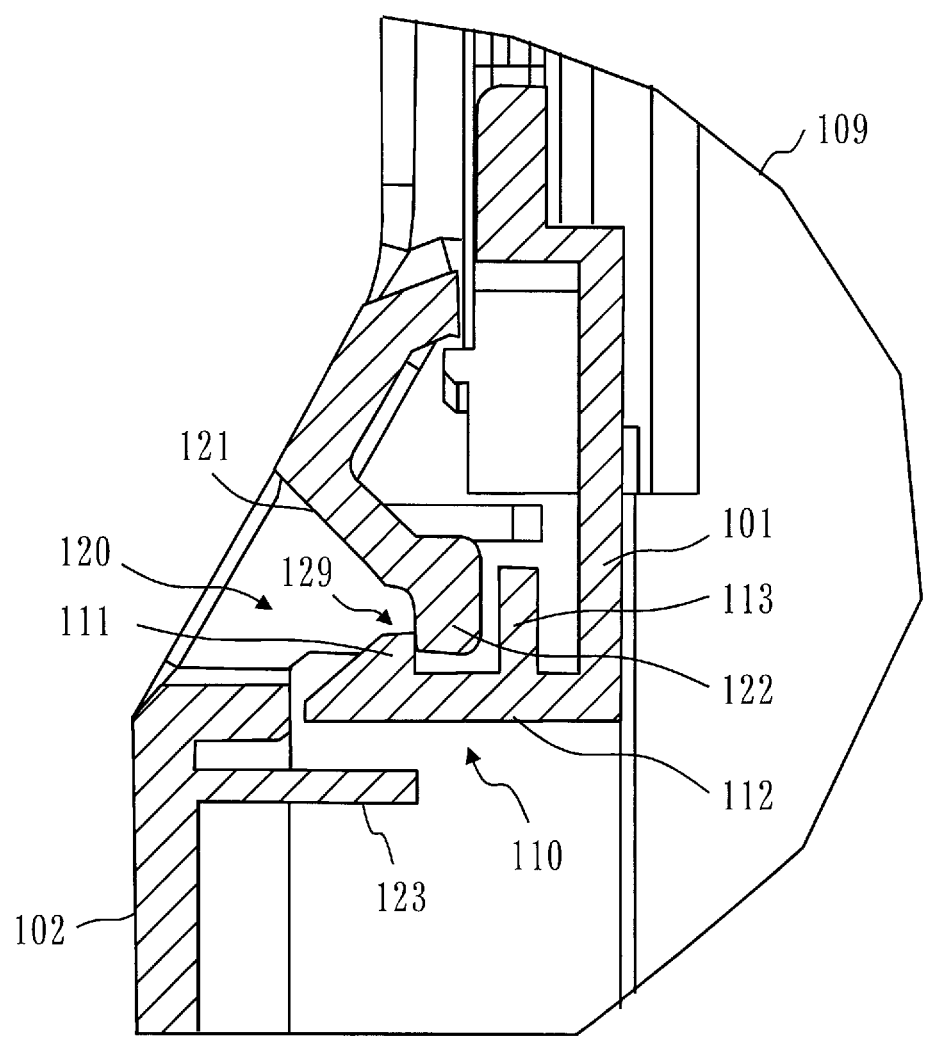
[FIG. 5]

FIG. 5 illustrates a side cross-sectional view of the fixed portion 109 when the case 101 is attached to the cover 102.

The hook 110 has a projection portion 113 in addition to the claw portion 111 and the body portion 112.

The projection portion 113 is a portion protruding from the body portion 112 and is a portion that strikes on the receiving portion 122 when the body portion 112 is inclined.

The other structure is the same as that according to the embodiment 1.

Description of Motion

A motion of the fixed portion 109 when the case 101 is detached from the cover 102 will be described with reference to FIGS. 6 and 7.

Figure 6:
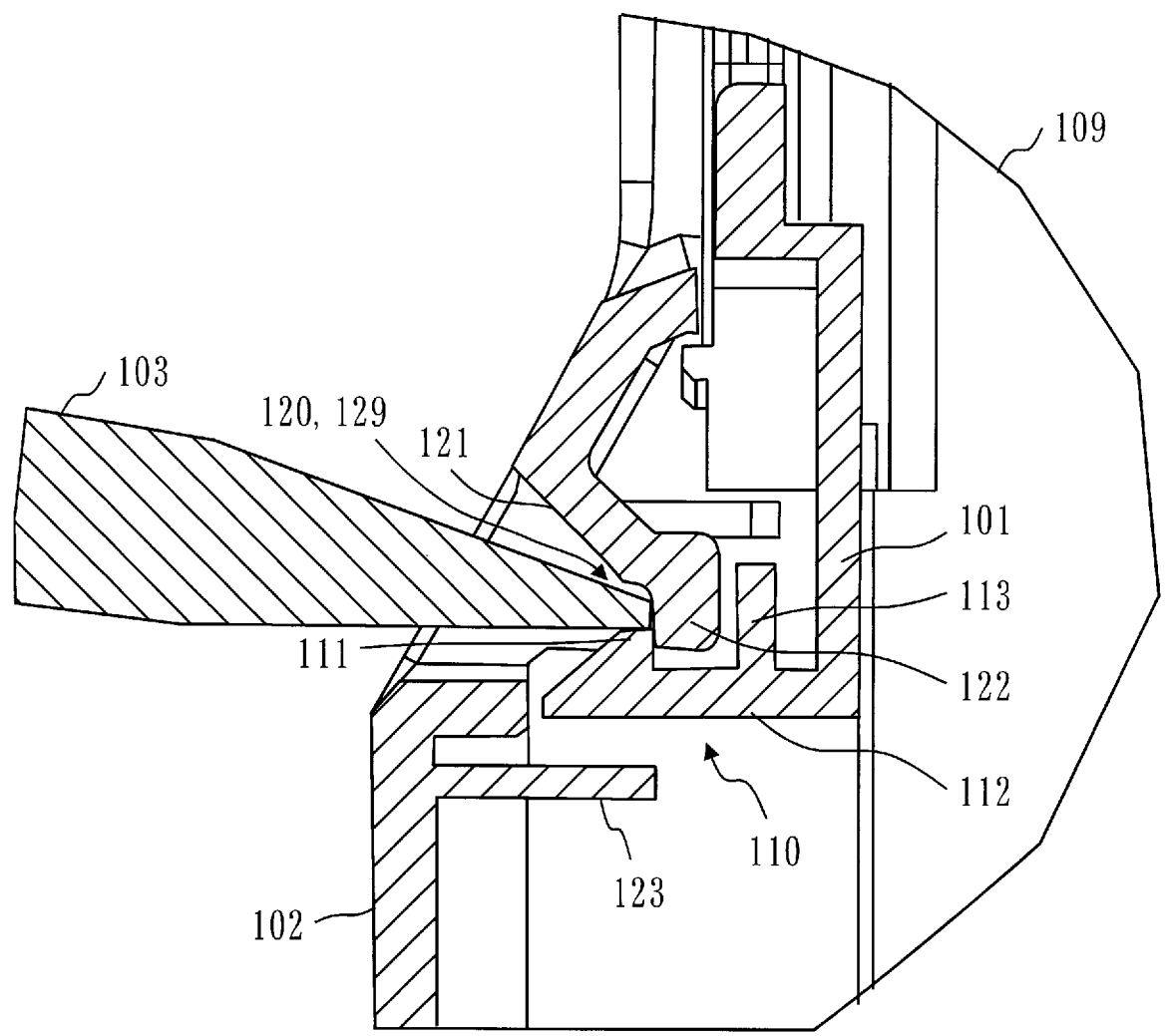
[FIG. 6]

In FIG. 6, the rod 103 is inserted into the insertion portion 120 and the tip end of the rod 103 is put into the gap 129. When the rod 103 is inclined toward the inclined portion 121, the fixed portion 109 turns into a state of FIG. 7.

Figure 7:
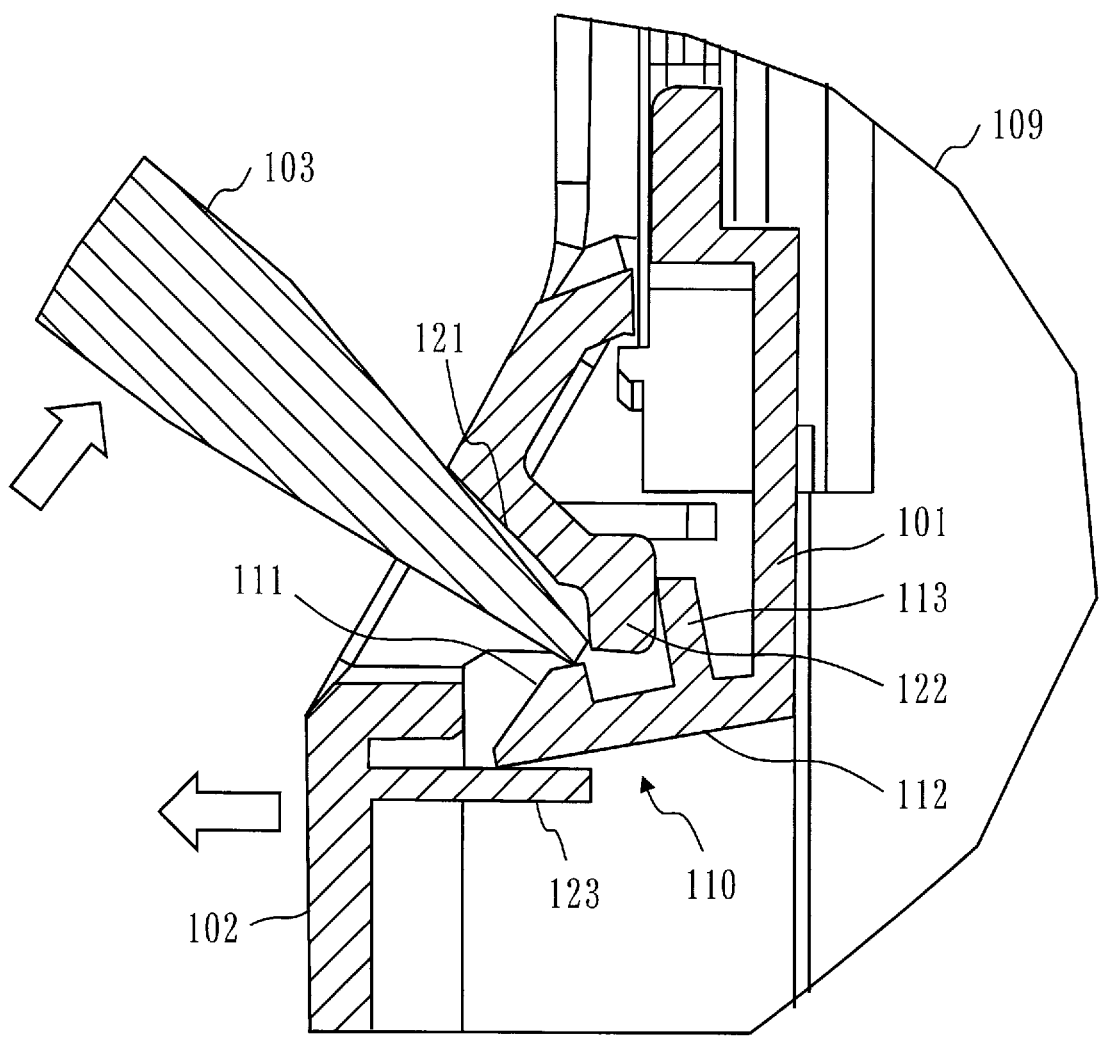
[FIG. 7]

In FIG. 7, when the rod 103 is inclined toward the inclined portion 121, the tip end of the rod 103 presses down the claw portion 111.

At this time, the body portion 112 of the hook 110 is bent, the body portion 112 thereof is inclined, and the claw portion 111 thereof is detached from the receiving portion 122.

Furthermore, when the claw portion 111 is detached from the receiving portion 122, then a tip end of the projection portion 113 strikes on a back surface of the receiving portion 122, and the projection portion 113 presses out the receiving portion 122. This can facilitate detaching the cover 102 from the case 101.

Advantageous Effects of Embodiment 2

The embodiment 2 can exhibit the following advantageous effects in addition to the same advantageous effects as those of the embodiment 1.

When the hook 110 provided in the case 101 is detached from the receiving portion 122 provided in the cover 102, the projection portion 113 of the hook 110 presses out the receiving portion 122. This can facilitate detaching the cover 102 from the case 101.

Embodiment 3

A mode in which a hook 130 is provided in the cover 102 will be described with reference to FIGS. 8 to 10. It is noted, however, that description overlapping with that of the embodiment 1 will be omitted or simplified.

Description of Configuration

Figure 8:
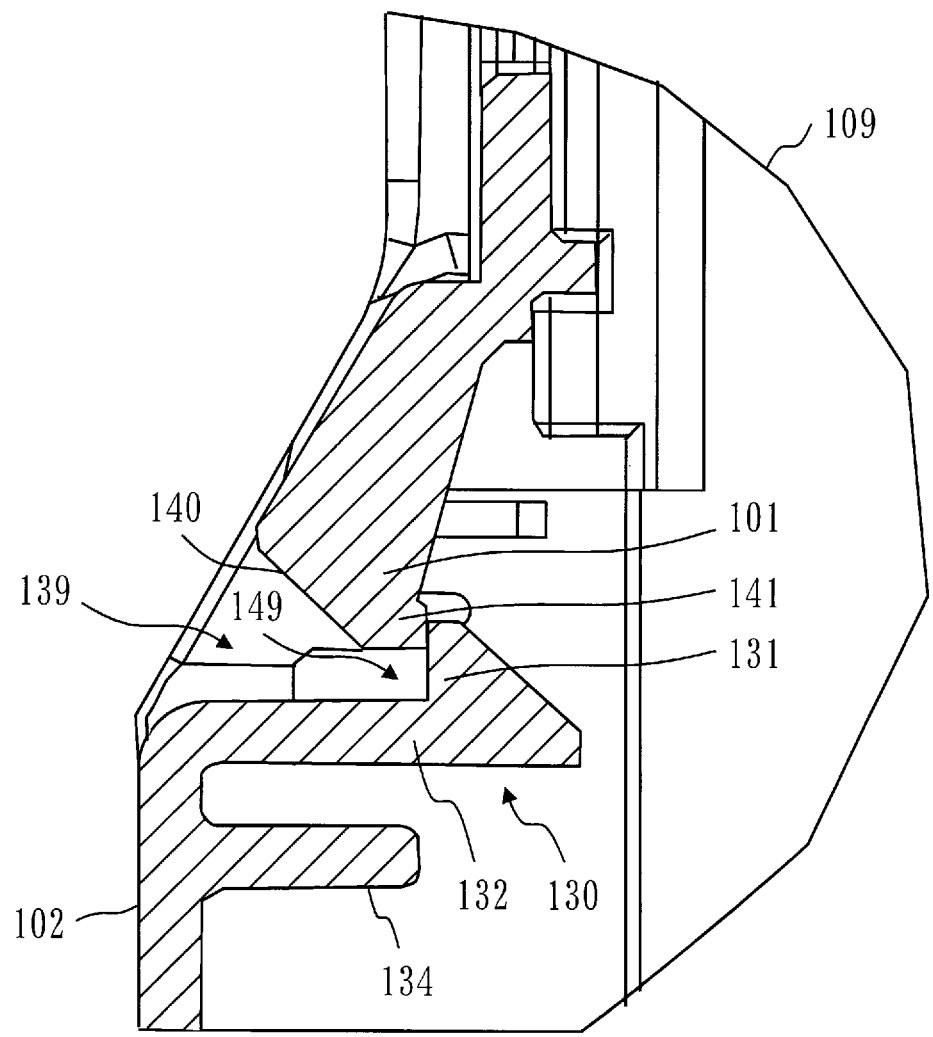
[FIG. 8]

FIG. 8 illustrates a side cross-sectional view of the fixed portion 109 when the cover 102 is attached to the case 101.

The cover 102 has the hook 130 caught on part of the case 101. The hook 130 exhibits flexibility. That is, the hook 130 can be bent.

Furthermore, the cover 102 has an insertion portion 139 into which a rod for detaching the hook 130 caught on part of the case 101 is inserted.

The case 101 has an inclined portion 140 and a receiving portion 141.

The inclined portion 140 is formed to be inclined and provided in a portion corresponding to the insertion portion 139.

The receiving portion 141 is a portion which is located on an inner side of the inclined portion 140 and on which the hook 130 is caught.

The hook 130 is a hook-shaped member, and has a claw portion 131 and a body portion 132.

The claw portion 131 is a portion caught on the receiving portion 141.

The body portion 132 is a portion continuous with the claw portion 131. Specifically, the claw portion 131 is provided in a portion of a tip end of the body portion 132.

The claw portion 131 has a height to such an extent that a gap 149 into which a tip end of the rod is put is generated between the body portion 132 and the receiving portion 141 when a tip end of the claw portion 131 is caught on the receiving portion 141.

Furthermore, the cover 102 has a restraint rib 134 that protrudes in the direction in which the case 101 is provided.

The restraint rib 134 is a plate-shaped member, and is provided in a portion on which part of the hook 130 strikes when the body portion 132 is inclined to such an extent that the claw portion 131 is detached from the receiving portion 141. Specifically, the restraint rib 134 is provided in a portion on which the body portion 132 strikes.

Description of Motion

A motion of the fixed portion 109 when the case 101 is detached from the cover 102 will be described with reference to FIGS. 9 and 10.

Figure 9:
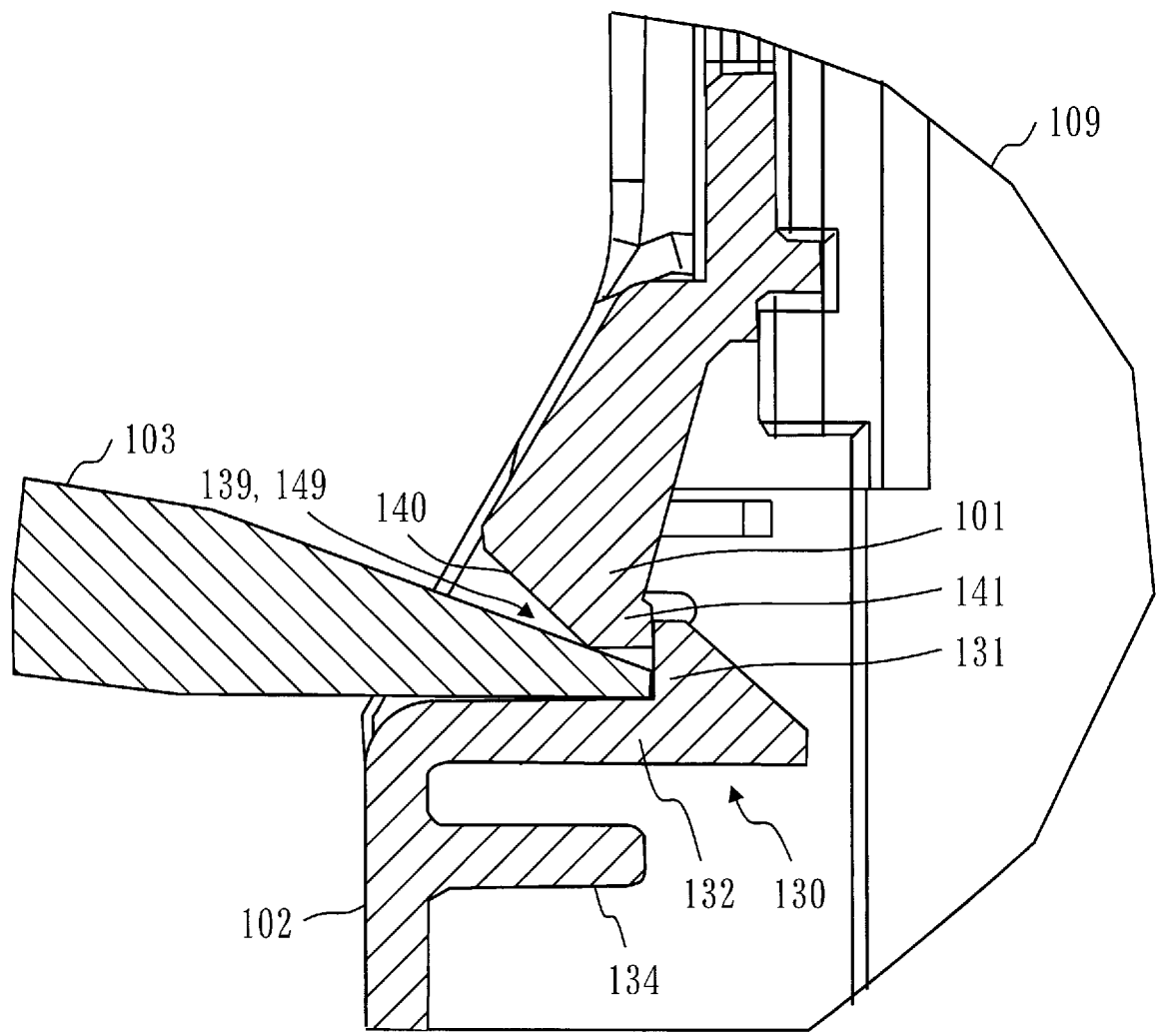
[FIG. 9]

In FIG. 9, the rod 103 is inserted into the insertion portion 139 and the tip end of the rod 103 is put into the gap 149. When the rod 103 is inclined toward the inclined portion 140, the fixed portion 109 turns into a state of FIG. 10.

Figure 10:
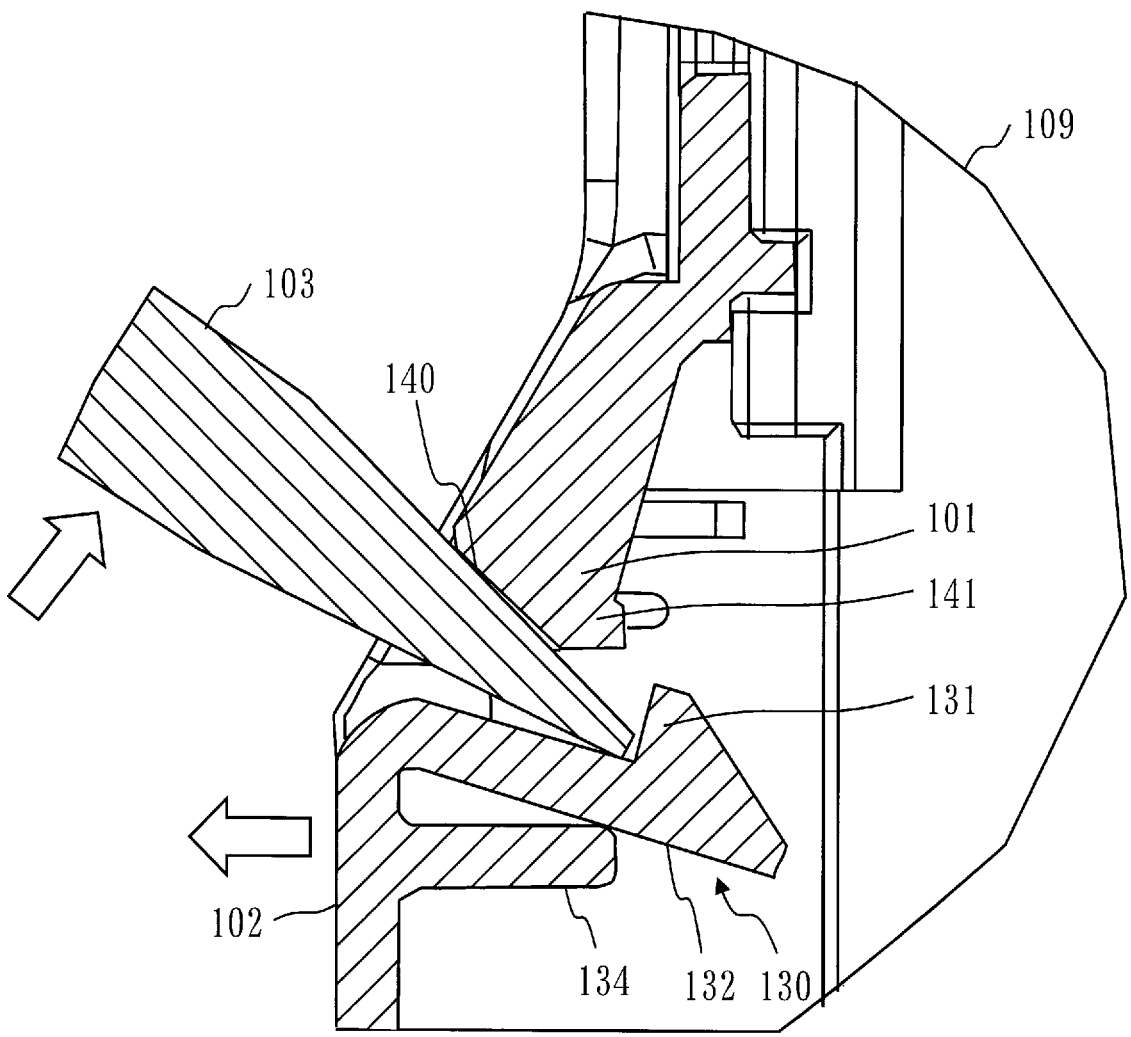
[FIG. 10]

In FIG. 10, when the rod 103 is inclined toward the inclined portion 140, the tip end of the rod 103 presses down the body portion 132.

At this time, the body portion 132 of the hook 130 is bent, the body portion 132 thereof is inclined, and the claw portion 131 thereof is detached from the receiving portion 141.

When the case 101 is separated from the cover 102 in this state, the case 101 can be detached from the cover 102.

Furthermore, when the body portion 132 is inclined to such an extent that the claw portion 131 is detached from the receiving portion 141, a back surface of the body portion 132 strikes on a tip end of the restraint rib 134. Specifically, when the rod 103 is inclined to such an extent that the rod 103 strikes on an inlet-side end portion of the inclined portion 140 and the body portion 132 is inclined, the back surface of the body portion 132 strikes on the tip end of the restraint rib 134.

Owing to this, a range in which the body portion 132 is bent is restricted. Specifically, an angle at which the hook 130 is bent at a base of the body portion 132 is restricted.

It is thereby possible to prevent breakage of the hook 130. Specifically, it is possible to prevent the hook 130 from being broken at the base of the body portion 132.

Advantageous Effects of Embodiment 3

Providing the inclined portion 140 as a guide at a time of performing attachment/detachment operation using the rod 103 enables the operation range of the rod 103 to be made clear.

Providing the restraint rib 134 that restricts a movement of the flexible hook 130 enables prevention of the breakage of the hook 130.

Other Configuration

A length by which the restraint rib 134 protrudes from the cover 102 may be increased. That is, the claw portion 131 may strike on the restraint rib 134 when the body portion 132 is inclined.

The inclined portion 140 restricts the range in which the rod 103 is inclined. As a result, a range in which a base of the hook 130 is bent is also restricted. Owing to this, it is not always necessary to provide the restraint rib 134 on the cover 102 for the purpose of preventing the breakage of the hook 130. That is, it is not always necessary to provide the restraint rib 134 in the portion on which part of the hook 130 strikes.

Embodiment 4

A mode in which the hook 130 has a cam structure will be described with reference to FIGS. 11 to 13. It is noted, however, that description overlapping with that of the embodiment 3 will be omitted or simplified.

Description of Configuration

Figure 11:
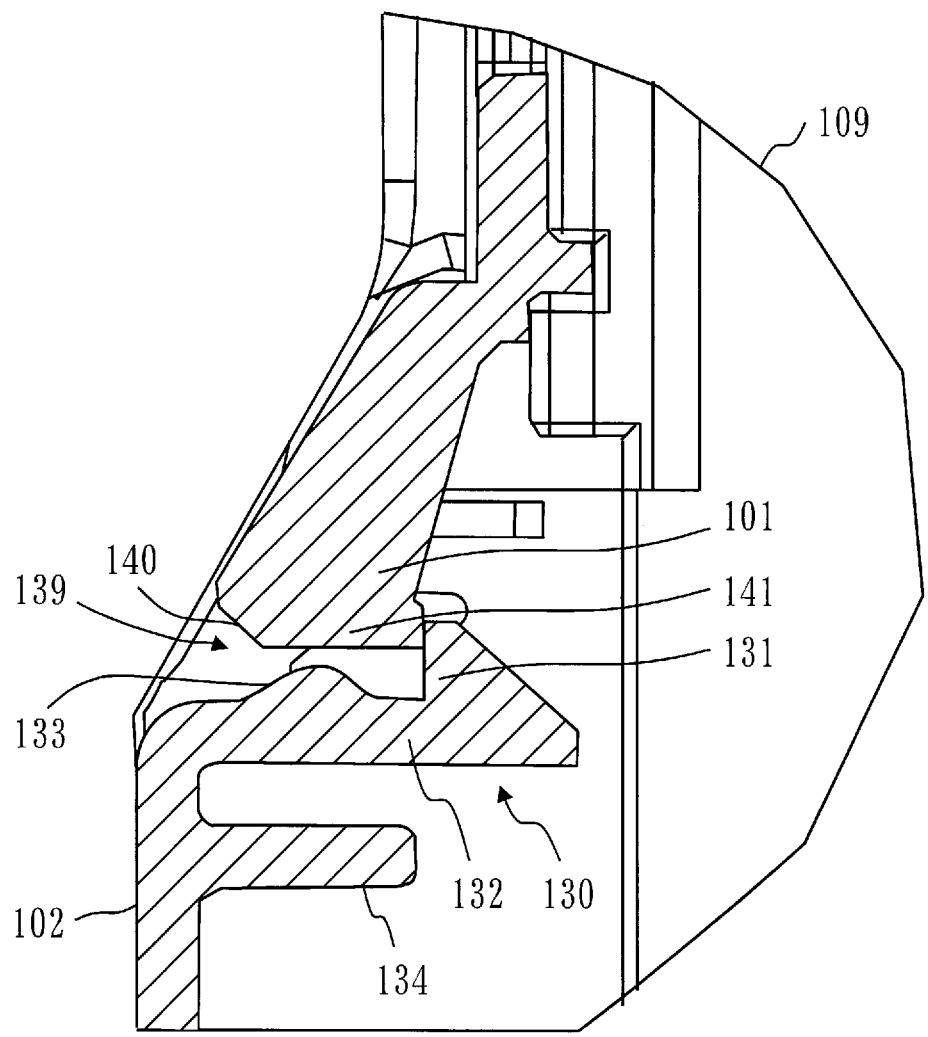
[FIG. 11]

FIG. 11 illustrates a side cross-sectional view of the fixed portion 109 when the case 101 is attached to the cover 102.

The cover 102 has the hook 130 caught on the receiving portion 141 of the case 101.

The hook 130 has the claw portion 131 and the body portion 132.

The claw portion 131 is caught on a tip end of the receiving portion 141.

The body portion 132 has a swelling portion 133 swelling in a direction, in which the receiving portion 141 is disposed, to be formed into a straight running cam shape.

The swelling portion 133 swells toward a side surface of the receiving portion 141.

Description of Motion

A motion of the fixed portion 109 when the case 101 is detached from the cover 102 will be described with reference to FIGS. 12 and 13.

Figure 12:
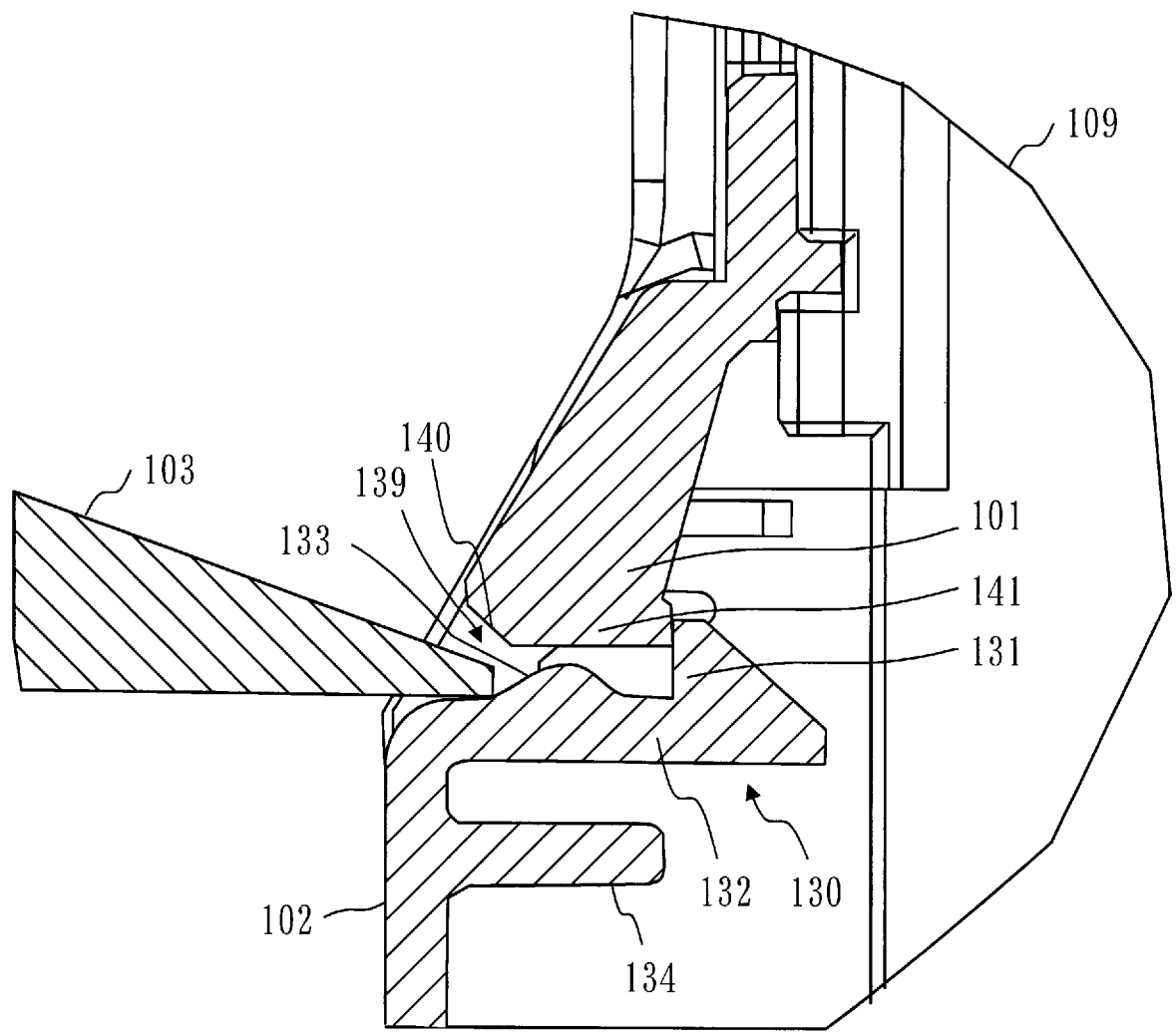
[FIG. 12]

In FIG. 12, the rod 103 is inserted into the insertion portion 139. When the rod 103 is pressed into the insertion portion 139, the fixed portion 109 turns into a state of FIG. 13.

Figure 13:
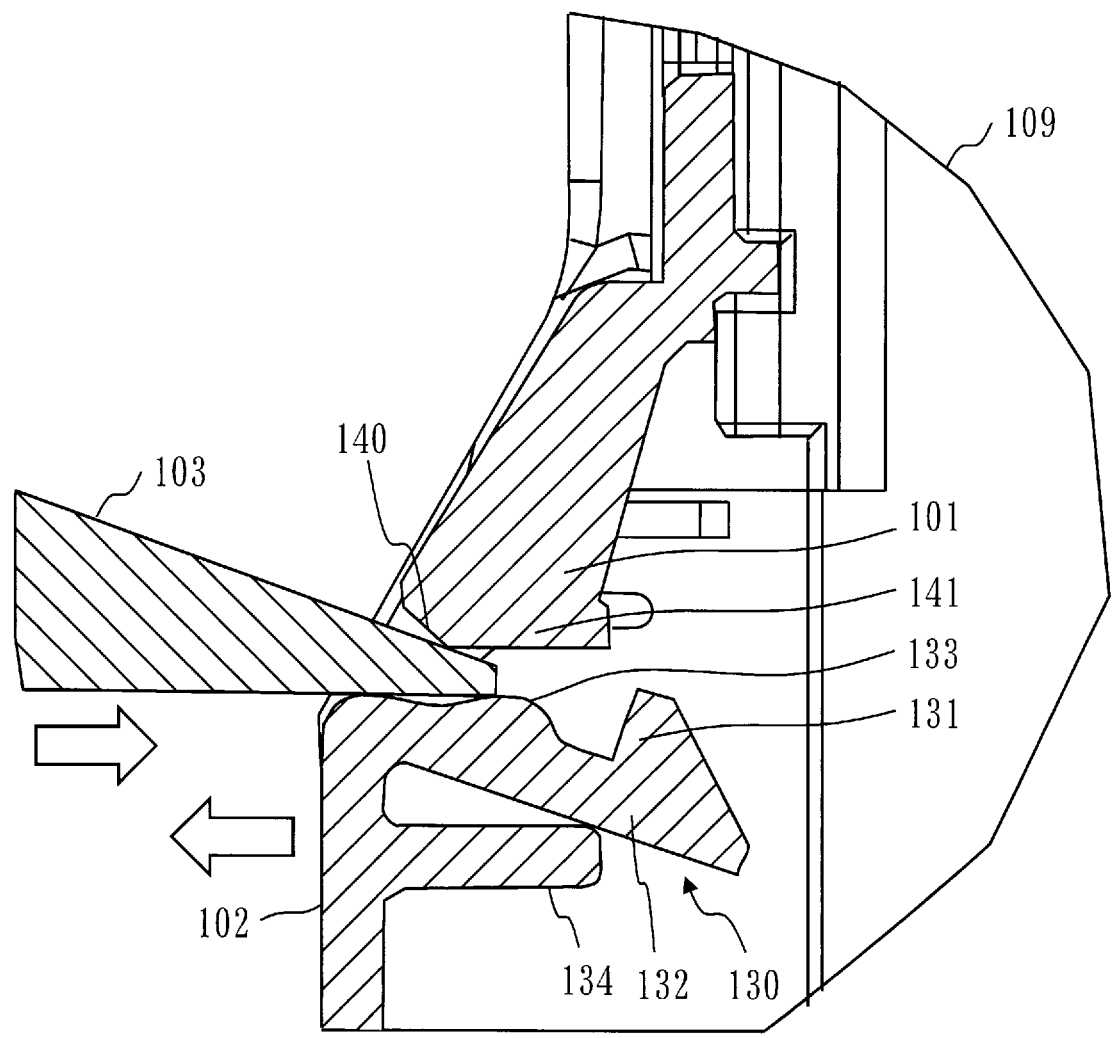
[FIG. 13]

In FIG. 13, when the rod 103 is pressed into an inner part from the insertion portion 139, the tip end of the rod 103 is put between the side surface of the receiving portion 141 and the swelling portion 133.

At this time, the body portion 132 of the hook 130 is bent, the body portion 132 thereof is inclined in a direction apart from the side surface of the receiving portion 141, and the claw portion 131 thereof is detached from the tip end of the receiving portion 141.

Furthermore, when the body portion 132 is inclined to such an extent that the claw portion 131 is detached from the tip end of the receiving portion 141, the back surface of the body portion 132 strikes on the tip end of the restraint rib 134. Specifically, when the rod 103 is pressed into an inner end portion of the inclined portion 140 and the base of the hook 130, the back surface of the body portion 132 strikes on the tip end of the restraint rib 134.

Owing to this, the range in which the base of the body portion 132 is bent is restricted. Specifically, the angle at which the hook 130 is bent at the base of the body portion 132 is restricted.

It is thereby possible to prevent breakage of the hook 130. Specifically, it is possible to prevent the hook 130 from being broken at the base of the body portion 132.

Advantageous Effects of Embodiment 4

Performing operation for pressing the rod 103 even without performing operation for inclining the rod 103 enables the hook 130 to be detached from the receiving portion 141.

Providing the restraint rib 134 that restricts the movement of the flexible hook 130 enables prevention of the breakage of the hook 130.

Other Configuration

The length by which the restraint rib 134 protrudes from the cover 102 may be increased. That is, the claw portion 131 may strike on the restraint rib 134 when the body portion 132 is inclined.

The rod 103 is not inserted into a part inner than a portion sandwiched between the inner end portion of the inclined portion 140 and the base of the hook 130. Owing to this, it is not always necessary to provide the restraint rib 134 on the cover 102 for the purpose of preventing the breakage of the hook 130. That is, it is not always necessary to provide the restraint rib 134 in the portion on which part of the hook 130 strikes.

Supplementation of Embodiments

While each embodiment illustrates a preferable mode, the preferable mode does not intend to limit the technical scope of the invention. Each embodiment may be implemented partially or may be combined with another embodiment.

REFERENCE SIGNS LIST

100: casing, 101: case, 102: cover, 103: rod, 109: fixed portion, 110: hook, 111: claw portion, 112: body portion, 113: projection portion, 120: insertion portion, 121: inclined portion, 122: receiving portion, 123: restraint rib, 129: gap, 130: hook, 131: claw portion, 132: body portion, 133: swelling portion, 134: restraint rib, 139: insertion portion, 140: inclined portion, 141: receiving portion, 149: gap.

The invention claimed is:

1. A casing comprising: a case configured to accommodate an object; and a cover attached to the case, wherein the cover includes: a hook caught on part of the case; and an insertion portion configured to receive a rod to detach the hook caught on part of the case, and the case includes: an inclined portion formed to be inclined and provided in a portion corresponding to the insertion portion; and a receiving portion that is a portion on which the hook is caught, wherein the hook includes: a claw portion caught on the receiving portion; and a body portion continuous with the claw portion, wherein a gap into which a tip end of the rod is put is generated between the body portion and the receiving portion when the claw portion is caught on the receiving portion, wherein when the rod is inserted into the insertion portion, the tip end of the rod is put into the gap, and the rod is inclined toward the inclined portion, then the claw portion is detached from the receiving portion, and wherein the cover is configured to limit a range by which the body portion is inclinable by restricting an angle at which the hook is bendable.

2. A casing comprising:
a case configured to accommodate an object; and
a cover attached to the case,
wherein the cover includes:
  a hook caught on part of the case; and
  an insertion portion configured to receive a rod to detach the hook caught on part of the case, and
the case includes:
  an inclined portion formed to be inclined and provided in a portion corresponding to the insertion portion; and
  a receiving portion that is a portion on which the hook is caught,
wherein the hook includes:
  a claw portion caught on the receiving portion; and
  a body portion continuous with the claw portion,
wherein a gap into which a tip end of the rod is put is generated between the body portion and the receiving portion when the claw portion is caught on the receiving portion,
wherein when the rod is inserted into the insertion portion, the tip end of the rod is put into the gap, and the rod is inclined toward the inclined portion, then the claw portion is detached from the receiving portion, and
wherein the cover includes a restraint rib that is a rib protruding in a direction in which the case is provided and that is a rib provided in a portion on which part of the hook strikes when the body portion is inclined to such an extent that the claw portion is detached from the receiving portion.

3. A casing comprising:

a case configured to accommodate an object; and a cover attached to the case, wherein the cover includes:
- a hook caught on part of the case; and
- an insertion portion configured to receive a rod to detach the hook caught on part of the case, and the case includes:
- an inclined portion formed to be inclined and provided in a portion corresponding to the insertion portion; and
- a receiving portion that is a portion on which the hook is caught, wherein the hook includes:
- a claw portion caught on the receiving portion; and
- a body portion continuous with the claw portion, and the body portion includes:
- a swelling portion swelling in a direction in which the receiving portion is disposed to be formed into a straight running cam.

4. The casing according to claim 3, wherein when the rod is inserted and pressed into the insertion portion, then the tip end of the rod is put between the receiving portion and the swelling portion, the body portion is inclined in a direction away from the receiving portion, and the claw portion is detached from the receiving portion.

5. The casing according to claim 4, wherein the cover includes a restraint rib that is a rib protruding in a direction in which the case is provided and that is a rib provided in a portion on which part of the hook strikes when the body portion is inclined to such an extent that the claw portion is detached from the receiving portion.

\* \* \* \* \*